United States Patent
Langens

(10) Patent No.: US 11,923,107 B2
(45) Date of Patent: Mar. 5, 2024

(54) HIGH-VOLTAGE BUSHING AND METHOD FOR MONITORING ITS OPERATION

(71) Applicant: Siemens Energy Global GmbH & Co. KG, Munich (DE)

(72) Inventor: Achim Langens, Lohmar (DE)

(73) Assignee: Siemens Energy Global GmbH & Co. KG, Munich (DE)

( * ) Notice: Subject to any disclaimer, the term of this patent is extended or adjusted under 35 U.S.C. 154(b) by 659 days.

(21) Appl. No.: 17/128,436

(22) Filed: Dec. 21, 2020

(65) Prior Publication Data

US 2021/0193352 A1    Jun. 24, 2021

(30) Foreign Application Priority Data

Dec. 20, 2019 (DE) .......................... 102019220367.1

(51) Int. Cl.
| | |
|---|---|
| H01B 17/00 | (2006.01) |
| G01R 31/12 | (2020.01) |
| H01B 17/26 | (2006.01) |
| H01B 17/36 | (2006.01) |

(52) U.S. Cl.
CPC ......... H01B 17/36 (2013.01); G01R 31/1254 (2013.01); H01B 17/26 (2013.01)

(58) Field of Classification Search
CPC ..... H01B 17/36; H01B 17/26; G01R 31/1254
See application file for complete search history.

(56) References Cited

U.S. PATENT DOCUMENTS

| | | | | | |
|---|---|---|---|---|---|
| 4,249,126 | A | * | 2/1981 | McConnell | .......... G01R 31/083 324/552 |
| 4,441,073 | A | * | 4/1984 | Davis | ................... G01R 31/088 324/544 |
| 5,075,544 | A | * | 12/1991 | Sato | ...................... H01H 33/563 356/402 |
| 2022/0044894 | A1 | * | 2/2022 | Nault | ...................... H02B 1/36 |

FOREIGN PATENT DOCUMENTS

| | | |
|---|---|---|
| CA | 1257185 A | 7/1989 |
| CN | 201514820 U | 6/2010 |
| DE | 4133947 A1 | 4/1993 |
| WO | WO 2019114933 A1 | 6/2019 |

OTHER PUBLICATIONS

CN 109541412 A; English Translation (Year: 2018).*
CN 201514820 U English Translation (Year: 2015).*

* cited by examiner

*Primary Examiner* — Pete T Lee
(74) *Attorney, Agent, or Firm* — Laurence A. Greenberg; Werner H. Stemer; Ralph E. Locher

(57) ABSTRACT

A high-voltage bushing has an insulator, which contains an insulating gas and an insulating solid, and an inner conductor which is led through the insulator. A mounting flange is employed for the mounting of the high-voltage bushing on a wall. A sensor, which is arranged on the mounting flange and is configured for the detection of at least one reaction product of the insulating gas and/or of the insulating solid. A corresponding method monitors an operating state of the high-voltage bushing.

8 Claims, 1 Drawing Sheet

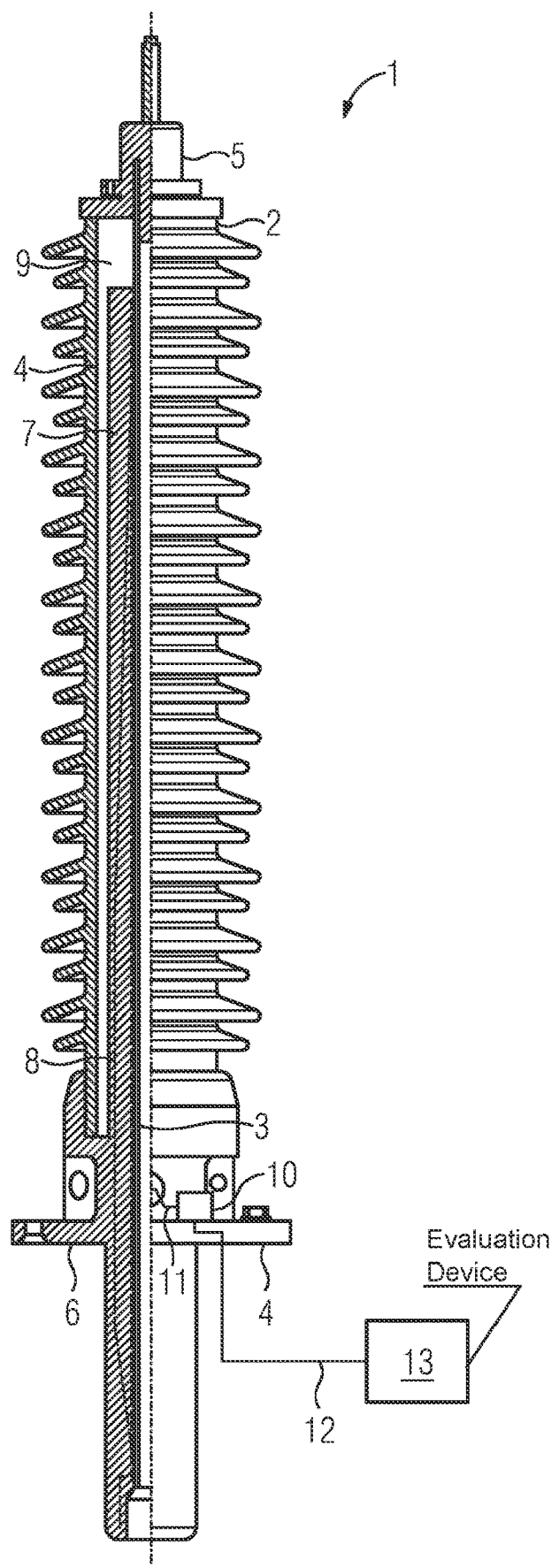

HIGH-VOLTAGE BUSHING AND METHOD FOR MONITORING ITS OPERATION

CROSS-REFERENCE TO RELATED APPLICATION

This application claims the priority, under 35 U.S.C. § 119, of German Patent Application DE 10 2019 220 367.1, filed Dec. 20, 2019; the prior application is herewith incorporated by reference in its entirety.

BACKGROUND OF THE INVENTION

Field of the Invention

The invention relates to a high-voltage bushing having an insulator, which contains (at least) one insulating gas and (at least) one insulating solid and an inner conductor which is led through the insulator, and having a mounting flange, which is employed for the mounting of the high-voltage bushing on a wall.

A high-voltage bushing is customarily rated for the insulation of high voltages in excess of 1 kV, preferably in excess of 100 kV. In general, the function of a high-voltage bushing of this type is the electrical insulation of the inner conductor of the high-voltage bushing which, in service, assumes a high-voltage potential, from a surrounding environment at a ground potential, for example a bay wall of a high-voltage installation or a tank wall of a transformer.

BRIEF SUMMARY OF THE INVENTION

The object of the invention is the proposal of a high-voltage bushing of the above-mentioned type, which is as reliable as possible in operation.

In a generic high-voltage bushing according to the invention, this object is fulfilled by a sensor, which is arranged on the mounting flange and is configured for the detection of at least one reaction product of the at least one insulating gas and/or of the at least one insulating solid. By the employment of the sensor, it is advantageously possible to analyze and evaluate secondary effects in the event of an electrical fault in the high-voltage bushing. In the event of an electrical fault, reactions are initiated in the insulating gas, for example by partial electrical discharges, such that reaction products of the insulating gas are produced, which can also be breakdown products. Moreover, the insulating solid, for example resin, paper or other insulating solids, such as synthetic sheet materials, can also be modified by reactions, such that reaction products are also produced. The detection of reaction products permits conclusions to be inferred with respect to an electrical state of the high-voltage bushing. Depending upon the type of fault, different reaction products can be constituted such that, moreover, a classification of the fault concerned can advantageously be executed. With the high-voltage bushing in service, the sensor is essentially at ground potential, as it is arranged on the mounting flange. This means that, advantageously, measurement data generated by means of the sensor can be transmitted relatively simply, in a wired arrangement, in the form of electrical signals, for example to an external evaluation unit. The sensor can be a gas sensor, which is employed, for example, in environmental engineering.

According to one form of embodiment of the invention, the insulator contains a resin-impregnated active part, and a secondary insulation containing the insulating gas. The secondary insulation can be arranged around the outside of the active part. The secondary insulation can contain e.g. a dry foam, which is filled with the insulating gas. The active part can be configured in the form of a winding, which is constituted by insulating layers of paper or plastic which are wound about a winding core, for example the inner conductor. The plastic is preferably a synthetic plastic, wherein a synthetic fabric is particularly preferred. These materials have proved to be particularly advantageous, particularly with respect to their insulating properties. The fabric preferably contains a synthetic polymer. The synthetic polymer can be, for example, a polyester, wherein polyethylene terephthalate (PET) is particularly preferred. Synthetic polymers are apolar, and are thus moisture-repellent.

A customary insulating gas is sulfur hexafluoride $SF_6$. A particular advantage of the use of $SF_6$ is that the reaction behavior, and thus the reaction products thereof are well-known. Moreover, the reaction products of the insulating solids employed are also sufficiently known.

Reaction products detected by means of the sensor can include, for example, one or more gases from the group comprising $SO_2$, $H_2$, $CH_4$, $CO$ and $CO_2$, wherein the above-mentioned list is naturally not definitive.

According to one form of embodiment of the invention, the high-voltage bushing is a DC voltage bushing for the insulation of a DC voltage. In AC voltage bushings, monitoring can be executed by an evaluation of a virtually sinusoidal electrical signal (voltage characteristic) on a measuring terminal of the high-voltage bushing. Conversely, DC voltage bushings can be operated with a wide variety of voltage waveshapes. For this reason, in many cases, an evaluation of the electrical voltage characteristic with acceptable technical complexity is not possible. Consequently, the evaluation of the reaction products of the insulating gas, and optionally of the insulating solid, is particularly advantageous in the case of a DC voltage bushing.

The invention further relates to a method for monitoring an operating state of a high-voltage bushing having an insulator, which contains (at least) one insulating gas and (at least) one insulating solid, an inner conductor which is led through the insulator, and a mounting flange.

The object of the invention is the disclosure of a method of this type which permits the most reliable operation possible of the high-voltage bushing.

This object is fulfilled according to the invention by a generic method in which, by means of a sensor which is arranged on the mounting flange, at least one reaction product of the insulating gas and/or of the insulating solid is detected, wherein a measuring signal is generated and evaluated. The insulating gas of the high-voltage bushing which, for example, is located in a gas compartment, is monitored for specific reaction products (including, for example, in the form of breakdown products) and, depending upon the type of contaminant or the corresponding combination of reaction products associated with the various faults, an evaluation of the reaction product, and correspondingly of the fault, is executed. The gas investigated can additionally contain breakdown products of the insulating solid, which are co-investigated by means of the sensor.

Preferably, for the detection of the reaction product, a gas sample is extracted from a gas compartment of the insulator, for example by aspiration, and is fed to the sensor. Corresponding feeder lines are provided for this purpose. Further to detection, the gas sample can be fed back to the gas compartment. One particular advantage of a method of this type is that it is not necessary for the sensor to be arranged in the gas compartment itself. Some insulating gases such as, for example, $SF_6$, are chemically corrosive, as a result of which a sensor arranged in the gas compartment can sustain damage after a prolonged service time.

It is not necessary for detection or measurement to be executed continuously. The gas sample is repeatedly extracted, and appropriately investigated thereafter, preferably at time intervals of at least 24 hours, for example once daily or once weekly. However, it is also conceivable for a smaller gas stream to be fed continuously to the sensor.

According to one form of embodiment, the evaluation contains a comparison with predefined reference data. In particular, an appraisal or evaluation can be executed on the basis of reference values which are saved in an appropriate database.

The evaluation appropriately contains a detection of a partial discharge in the high-voltage bushing. In general, an option is provided in this manner for the detection of persistent faults, such as small partial discharges, which can compromise the reliability of the high-voltage bushing. In particular, the partial discharge can also include a partial breakdown. As a further characteristic variable, the dielectric loss factor is also conceivable. This is given by the ratio between an ohmic current and an exclusively capacitive current in the dielectric of the insulator. By reference to the loss factor, the state of an insulating material can be evaluated. Evaluation can be executed by means of the sensor itself, or by an appropriate evaluation unit which is connected to the sensor for the exchange of signals or data. The resulting findings can be employed as a monitoring criterion or a disconnection criterion.

The abovementioned method can moreover be executed in combination with a number of or with all of the previously disclosed features of the high-voltage bushing.

Other features which are considered as characteristic for the invention are set forth in the appended claims.

Although the invention is illustrated and described herein as embodied in a high-voltage bushing and a method for monitoring its operation, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The FIGURE of the drawing is an illustration of an exemplary embodiment of a high-voltage bushing according to the invention.

DETAILED DESCRIPTION OF THE INVENTION

Referring now to the single FIGURE of the drawing in detail, there is shown a high-voltage bushing 1. The high-voltage bushing 1 contains an insulator 2. A tubular inner conductor 3 is led through the insulator 2.

The insulator 2 contains a housing 4 which, in the example represented in the FIGURE, is formed of a porcelain body. The housing 4 extends between a head fitting 5 and a mounting flange 6. During the operation of the high-voltage bushing 1, the inner conductor 3 is at an electrical potential in excess of 100 kV, whereas the mounting flange 6 is essentially at ground potential. Alternatively, the housing can be comprised, for example, of a glass fiber-reinforced epoxy resin tube, onto which shields of silicone elastomer are vulcanized.

The insulator 2 contains an active part 7, which is comprised of insulating layers of paper or synthetic fabric which are impregnated with an epoxy resin. The active part 7 further contains coaxially arranged control inserts of aluminum foil, which are arranged in the region of the active part which is represented by a broken line 8, and are responsible for uniform voltage distribution on the insulator 2. Between the housing 4 and the active part, a gas compartment 9 is situated, which is at least partially filled with an insulating gas and a secondary insulation of dry foam. The insulator 2 thus contains a plurality of insulating solids, particularly resin, paper or fabric and dry foam.

On the mounting flange 4, a sensor 10 is arranged, which is connected to the gas compartment 9 by means of a feeder line 11. A sample of the insulating gas can be fed to the sensor by means of the feeder line 11. The sensor 10 is further connected by means of an electric cable connection 12 to an evaluation unit 13. The evaluation unit 13 is configured to evaluate a measuring signal which is delivered by means of the sensor 10, and to generate corresponding fault indicators.

The fundamental operating principle of a monitoring function of the high-voltage bushing 1 can be described as follows. At regular intervals (for example, once daily), a gas sample is fed to the sensor 10 via the feeder line 11. The sensor 10 can detect the reaction products of the insulating gas or the insulating solids associated with the occurrence of a fault in the gas compartment 9. Thereafter, the sensor 10 generates a measuring signal, which contains information on reaction products identified in the gas sample. The measuring signal is then relayed to the evaluation unit 13. The evaluation unit 13 executes an analysis of the measuring signal and, by way of an analysis result, for example, delivers a categorization of the operating state. Alternatively, the analysis is executed by means of the sensor 10 itself, wherein the result is routed to a superordinate monitoring unit. On the basis of the result, measures are optionally implemented, such as maintenance measures and/or a disconnection.

The invention claimed is:

1. A high-voltage bushing, comprising:
an insulator having an insulating gas and an insulating solid;
an inner conductor being led through said insulator;
a mounting flange; and
a sensor disposed on said mounting flange and configured for a detection of at least one reaction product of said insulating gas and/or of said insulating solid, wherein said at least one reaction product consists of at least one gas selected from the group consisting of: $SO_2$, $H_2$, $CH_4$, $CO$ and $CO_2$.

2. The high-voltage bushing according to claim 1, wherein said insulator has a resin-impregnated active part and a secondary insulation containing the insulating gas.

3. The high-voltage bushing according to claim 1, wherein said insulating gas is $SF_6$.

4. The high-voltage bushing according to claim 1, wherein the high-voltage bushing is a DC voltage bushing for an insulation of a DC voltage.

5. A method for monitoring an operating state of a high-voltage bushing having an insulator with an insulating gas and an insulating solid, an inner conductor which is led through the insulator, a mounting flange, and a sensor, which comprises the steps of:

detecting, by means of the sensor being disposed on the mounting flange, at least one reaction product of the insulating gas and/or of the insulating solid, wherein, for a detection of the reaction product, extracting a gas sample from a gas compartment of the insulator and feeding the gas sample to the sensor; and generating and evaluating a measuring signal.

6. The method according to claim 5, wherein the gas sample is repeatedly extracted at time intervals of at least 24 hours.

7. The method according to claim 5, wherein the evaluating step includes a comparison with predefined reference data.

8. The method according to claim 5, wherein the evaluating step includes a detection of a partial discharge in the high-voltage bushing.

\* \* \* \* \*